US012584978B2

(12) United States Patent
Yamawaki et al.

(10) Patent No.: US 12,584,978 B2
(45) Date of Patent: Mar. 24, 2026

(54) MAGNETIC SENSOR DEVICE AND METHOD OF MANUFACTURING THE SAME

(71) Applicant: TDK CORPORATION, Tokyo (JP)

(72) Inventors: Kazuma Yamawaki, Tokyo (JP); Shuhei Miyazaki, Tokyo (JP)

(73) Assignee: TDK Corporation, Tokyo (JP)

( * ) Notice: Subject to any disclaimer, the term of this patent is extended or adjusted under 35 U.S.C. 154(b) by 93 days.

(21) Appl. No.: 18/448,444

(22) Filed: Aug. 11, 2023

(65) Prior Publication Data

US 2024/0085499 A1 Mar. 14, 2024

(30) Foreign Application Priority Data

Sep. 14, 2022 (JP) ................................. 2022-146434

(51) Int. Cl.
*G01R 33/09* (2006.01)
(52) U.S. Cl.
CPC .................................. *G01R 33/098* (2013.01)
(58) Field of Classification Search
CPC .............. G01R 33/098; G01R 33/0047; G01R 33/0052; G01R 33/063
See application file for complete search history.

(56) References Cited

U.S. PATENT DOCUMENTS

| | | | |
|---|---|---|---|
| 11,162,772 B2 | 11/2021 | Watanabe et al. | |
| 2017/0059361 A1* | 3/2017 | Nagarkar | A61B 5/062 |
| 2019/0107585 A1* | 4/2019 | Huber Lindenberger | ................... G01R 33/0035 |
| 2020/0191547 A1* | 6/2020 | Watanabe | G01R 33/09 |
| 2021/0382124 A1* | 12/2021 | Ohta | H01F 10/3268 |

FOREIGN PATENT DOCUMENTS

JP       2020-094883 A       6/2020

* cited by examiner

*Primary Examiner* — Alvaro E Fortich
(74) *Attorney, Agent, or Firm* — Oliff PLC

(57) ABSTRACT

A magnetic sensor device includes a stacked structure including a sensor substrate and a sensor element circuitry. The sensor substrate has a surface and a perimeter. The sensor element circuitry is provided on the surface of the sensor substrate, has a perimeter, and includes one or more magnetic sensor elements. As viewed in a plane parallel to the surface, a portion or all of the perimeter of the sensor element circuitry is located at a position different from a position of the perimeter of the sensor substrate.

17 Claims, 11 Drawing Sheets

MAGNETIC SENSOR DEVICE AND METHOD OF MANUFACTURING THE SAME

CROSS-REFERENCE TO RELATED APPLICATIONS

The present application claims priority from Japanese Patent Application No. 2022-146434 filed on Sep. 14, 2022, the entire contents of which are hereby incorporated by reference.

BACKGROUND

The disclosure relates to a magnetic sensor device and a method of manufacturing the magnetic sensor device.

A magnetic sensor device adapted to detect a component, in a predetermined direction, of an external magnetic field has been used in various applications. A magnetic sensor to be included in the magnetic sensor device may have a magnetic detection element provided on a substrate. Examples of the magnetic detection element include a magnetoresistive effect element.

For example, Japanese Unexamined Patent Application Publication (JP-A) No. 2020-094883 discloses a magnetic sensor device including a support, a first magnetic sensor, a first magnetic field generator, and a second magnetic field generator. The first magnetic sensor is integral with the support. In the magnetic sensor device disclosed in JP-A No. 2020-094883, the first magnetic field generator generates a first additional magnetic field and the second magnetic field generator generates a second additional magnetic field, which allows for accurate detection of an external magnetic field by the first magnetic sensor.

SUMMARY

A magnetic sensor device according to one embodiment of the disclosure includes a stacked structure including a sensor substrate and a sensor element circuitry. The sensor substrate has a surface and a perimeter. The sensor element circuitry is provided on the surface of the sensor substrate, has a perimeter, and includes one or more magnetic sensor elements. As viewed in a plane parallel to the surface, a portion or all of the perimeter of the sensor element circuitry is located at a position different from a position of the perimeter of the sensor substrate.

A method of manufacturing a magnetic sensor device according to one embodiment of the disclosure includes: forming a plurality of sensor element circuitries discretely on a first surface of a mother substrate, the sensor element circuitries each including one or more magnetic sensor elements; forming one or more trenches surrounding individual ones of the sensor element circuitries, by digging, from the first surface of the mother substrate, into one or more gap portions of the mother substrate that are each located in a gap region between adjacent ones of the sensor element circuitries; and separating the mother substrate into a plurality of sensor substrates by polishing the mother substrate from a second surface of the mother substrate to reach the one or more trenches. In the method, forming the one or more trenches includes causing a portion or all of a perimeter of each of the sensor element circuitries to protrude outward relative to a wall face of corresponding one of the one or more trenches as viewed in a plane parallel to the first surface, or causing a portion or all of the perimeter of each of the sensor element circuitries to be recessed inward relative to the wall face of corresponding one of the one or more trenches as viewed in the plane parallel to the first surface.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

DETAILED DESCRIPTION

Figure 1A:
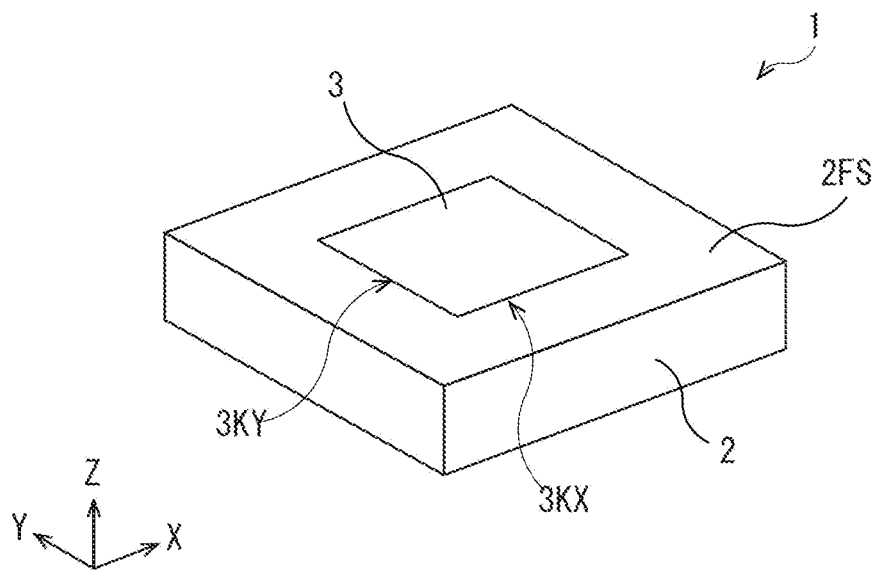
FIG. 1A is a first perspective diagram illustrating an overall configuration example of an angle sensor device according to one example embodiment of the disclosure.

It is desirable that a magnetic sensor device including a magnetic sensor achieve reduction in thickness as well as high measurement accuracy.

It is desirable to provide a magnetic sensor device that provides high measurement accuracy and is adaptable to further reduction in thickness.

In the following, some example embodiments of the disclosure are described in detail with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale. Throughout the present specification and the drawings, elements having substantially the same function and configuration are denoted with the same reference numerals to avoid any redundant description. In addition, elements that are not directly related to any embodiment of the disclosure are unillustrated in the drawings. Note that the description is given in the following order.

0. Background
1. Example Embodiment: an example of an angle sensor
   device including a magnetoresistive effect element
     1.1. Configuration of Angle Sensor Device 1
     1.2. Method of Manufacturing Angle Sensor Device 1
     1.3. Example Workings and Example Effects
2. Examples

0. BACKGROUND

An angle sensor device has been used that detects, for example, an orientation or a rotation angle of an object by sensing a change in an external magnetic field, for example. Such an angle sensor device is often attached to an object that makes a movement involving a change in orientation, such as a rotational movement, to thereby make a rotational movement or any other kind of movement together with the object. Accordingly, reduction in weight is demanded of the angle sensor device itself. Furthermore, improved measurement accuracy is also demanded. To meet such demands, it is desirable to densely pack a larger number of sensor elements in a limited region.

Having conducted many studies and improvements to address the above technical challenges, the Applicant has finally arrived at providing an angle sensor device that provides high measurement accuracy and is adaptable to further reduction in thickness.

1. FIRST EXAMPLE EMBODIMENT

[1.1. Configuration of Angle Sensor Device 1]

A description will be given first of a configuration of an angle sensor device 1 according to an example embodiment of the disclosure with reference to FIGS. 1A to 4. The angle sensor device 1 may correspond to a specific but non-limiting example of a "magnetic sensor device" in one embodiment of the disclosure.

Figure 1B:
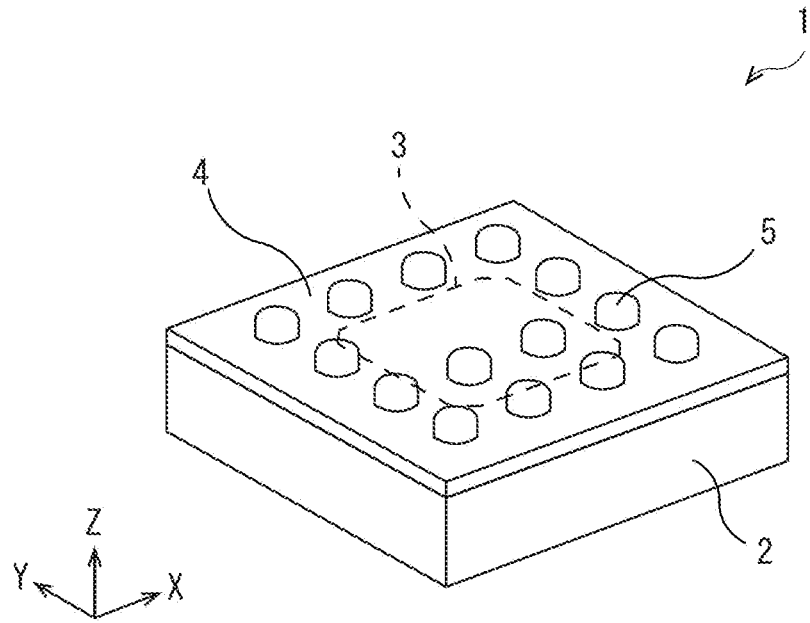
FIG. 1B is a second perspective diagram illustrating the overall configuration example of the angle sensor device according to one example embodiment of the disclosure.
Figure 2:
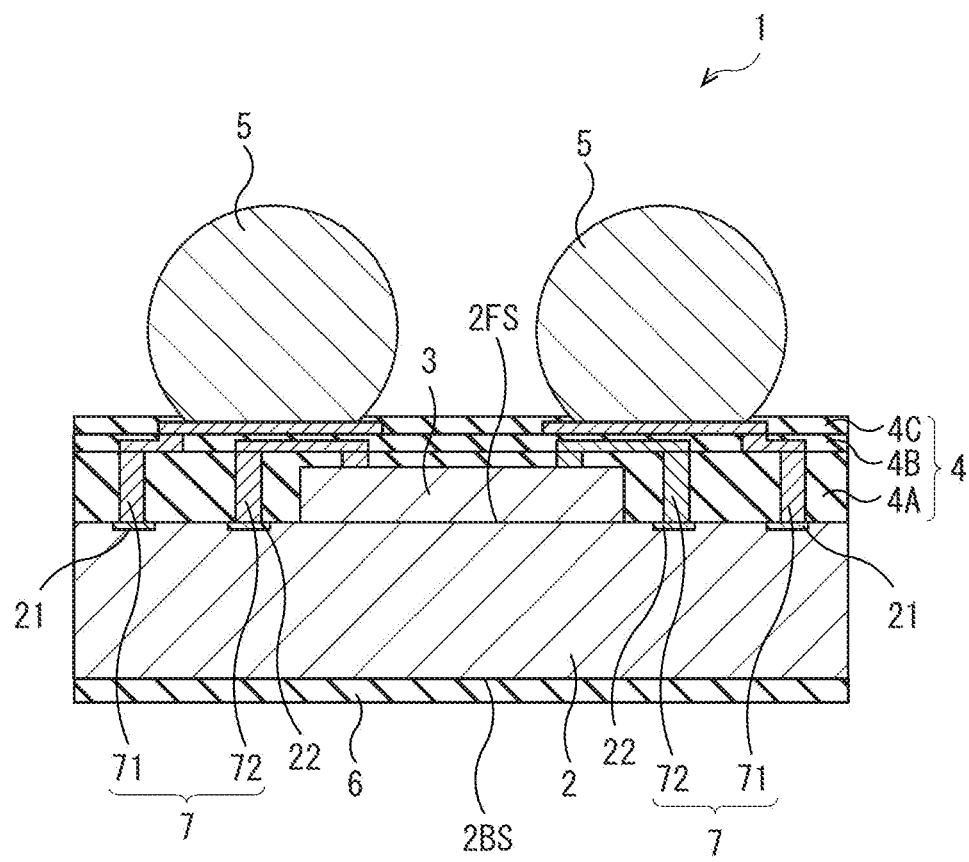
FIG. 2 is a cross-sectional view of the angle sensor device illustrated in FIG. 1A.
Figure 2:
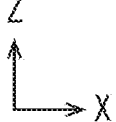

FIGS. 1A and 1B are perspective diagrams each illustrating an overall configuration example of the angle sensor device 1. FIG. 2 is a schematic cross-sectional view of the angle sensor device 1. As illustrated in FIG. 1B, the angle sensor device 1 may include a support substrate 2, a sensor chip 3, a wiring layer 4, and solder balls 5. As illustrated in FIG. 2, the sensor chip 3 may be stacked on the support substrate 2. For example, the sensor chip 3 may be provided on a front surface 2FS of the support substrate 2. The sensor chip 3 may be covered with the wiring layer 4. A protective film 6 may be provided on a back surface 2BS, opposite to the front surface 2FS, of the support substrate 2.

In the example embodiment, as illustrated in FIGS. 1A to 2, for example, the support substrate 2 and the sensor chip 3 may each extend along an XY plane including an X-axis direction and a Y-axis direction orthogonal to each other. AZ-axis direction may correspond to a thickness direction of the support substrate 2 and the sensor chip 3 in the example embodiment.

[Support Substrate 2]

In some embodiments, the support substrate 2 may include an application-specific integrated circuit (ASIC), for example. The front surface 2FS of the support substrate 2 may be provided with terminal parts 21 and 22. Note that the support substrate 2 is not limited to a substrate including the ASIC, and may be a simple Si substrate or sapphire substrate, or a relay substrate that performs relaying between a substrate including an ASIC and the sensor substrate 3, for example.

[Sensor Chip 3]

Figure 3A:
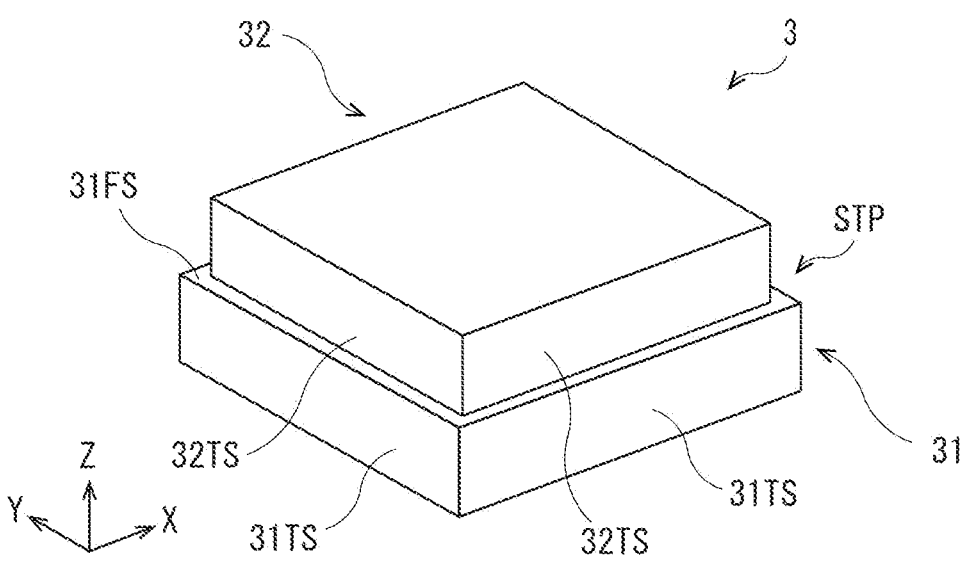
FIG. 3A is a perspective diagram illustrating an example external appearance of a sensor chip illustrated in FIG. 1A.
Figure 3B:
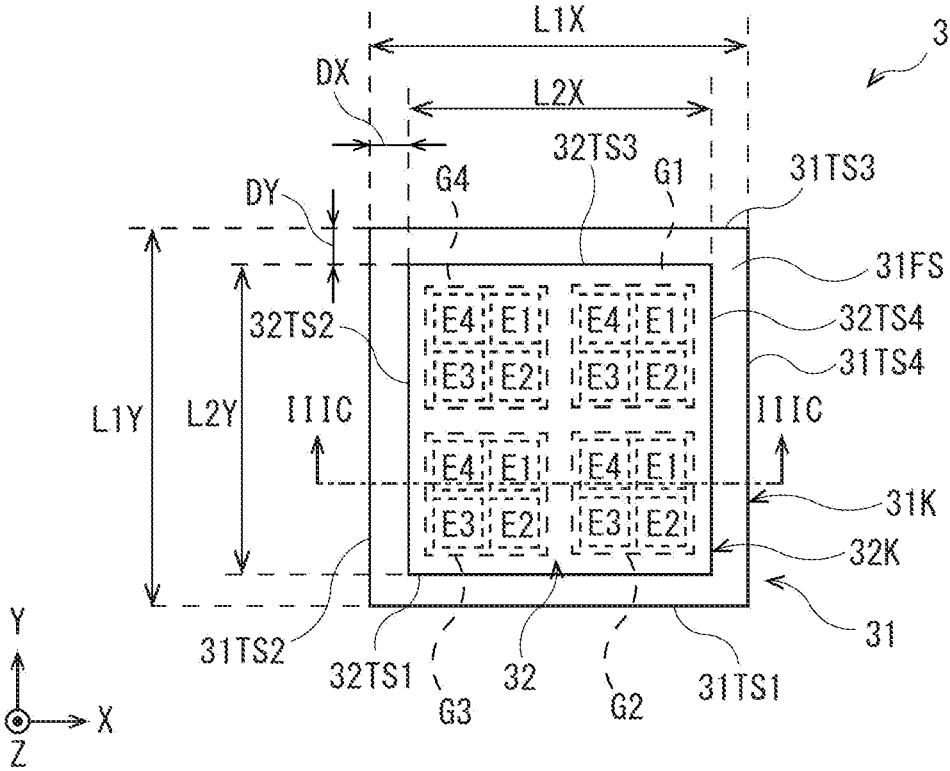
FIG. 3B is a plan diagram illustrating a planar configuration example of the sensor chip illustrated in FIG. 1A.
Figure 3C:
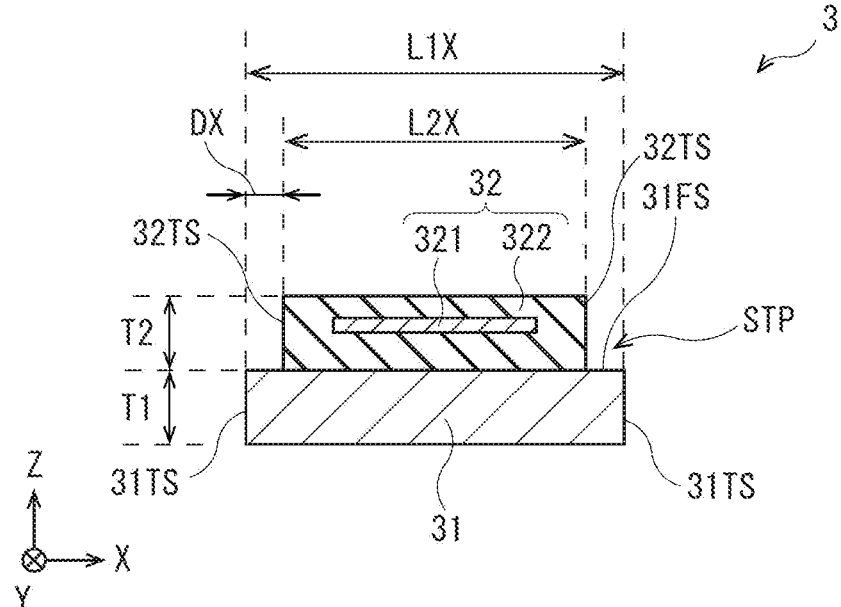
FIG. 3C is a cross-sectional diagram illustrating a cross-sectional configuration example of the sensor chip illustrated in FIG. 1A.

FIG. 3A is a perspective diagram schematically illustrating an example external appearance of the sensor chip 3. In a configuration example illustrated in FIG. 3A, the sensor chip 3 may have an external appearance of a substantially quadrangular prism shape which is substantially square or rectangular in a planar view along the XY plane. The sensor chip 3 may include a sensor substrate 31 and a sensor element circuitry 32. In the sensor chip 3, the sensor substrate 31 and the sensor element circuitry 32 may configure a stacked structure. The sensor chip 3 may have a step STP extending over an entire periphery of the stacked structure along the XY plane. FIG. 3B is a plan diagram schematically illustrating a layout of the sensor chip 3. FIG. 3C is a cross-sectional diagram illustrating a configuration example of the sensor chip 3 in a cross section.

The sensor substrate 31 may be a silicon substrate, for example. The sensor substrate 31 may have a thickness of 200 μm or less, for example. In the configuration example of the sensor chip 3 illustrated in FIGS. 3A and 3B, the sensor substrate 31 may be a flat plate member having a front surface 31FS that is substantially square or rectangular in a planar view. For example, the front surface 31FS may have a perimeter 31K that is substantially square or rectangular. The front surface 31FS may be a flat surface that is substantially orthogonal to the Z-axis direction, i.e., a thickness direction of the sensor substrate 31. In the XY plane, the sensor substrate 31 may have a length L1X in the X-axis direction and a length L1Y in the Y-axis direction. The length L1X and the length L1Y may be equal to or different from each other. The sensor substrate 31 may have four end faces 31TS1 to 31TS4 along the perimeter 31K. In this specification, the four end faces 31TS1 to 31TS4 may be collectively referred to as an end face 31TS, without being distinguished from each other. The end face 31TS may be a flat surface that is substantially orthogonal to the front surface 31FS, for example. In some embodiments, the end face 31TS may be inclined with respect to the front surface 31FS. For example, the end face 31TS and the front surface 31FS may form an angle other than 90 degrees therebetween. Further, the end face 31TS is not limited to a flat surface and may be a curved surface. Moreover, the end face 31TS may partly include a flat surface, a curved surface, or both.

The sensor element circuitry 32 may be provided in a middle region on the front surface 31FS of the sensor substrate 31. In the example illustrated in FIGS. 3A and 3B, the sensor element circuitry 32 may be smaller in footprint along the XY plane than the sensor substrate 31. Accordingly, as described above, the step STP may be present on the periphery of the sensor substrate 31 and the sensor element circuitry 32. As with the sensor substrate 31, the sensor element circuitry 32 may extend along the XY plane and may have a substantially square or rectangular shape in a planar view. For example, the sensor element circuitry 32 may have a perimeter 32K that is substantially square or rectangular. In a planar view, that is, as viewed in the Z-axis direction, all of the perimeter 32K of the sensor element circuitry 32 may be located at a position different from a position of the perimeter 31K of the sensor substrate 31. In the configuration example of the sensor chip 3 illustrated in FIGS. 3A to 3C, all of the perimeter 32K of the sensor element circuitry 32 may be located on an inner side relative to the perimeter 31K of the sensor substrate 31 as viewed in a plane parallel to the front surface 31FS.

In the XY plane, the sensor element circuitry 32 may have a length L2X in the X-axis direction and a length L2Y in the Y-axis direction. The length L2X and the length L2Y may be equal to or different from each other. Note that the length L2X may be shorter than the length L1X, and the length L2Y may be shorter than the length L1Y. The sensor element circuitry 32 may have four end faces 32TS1 to 32TS4 along the perimeter 32K. In this specification, the four end faces 32TS1 to 32TS4 may be collectively referred to as an end face 32TS, without being distinguished from each other. The end face 32TS may be a flat surface that is substantially orthogonal to the front surface 31FS of the sensor substrate 31, for example. In some embodiments, the end face 32TS may be inclined with respect to the front surface 31FS. For example, the end face 32TS and the front surface 31FS may form an angle other than 90 degrees therebetween. Further, the end face 32TS is not limited to a flat surface and may be a curved surface. Moreover, the end face 32TS may partly include a flat surface, a curved surface, or both.

Figure 4:
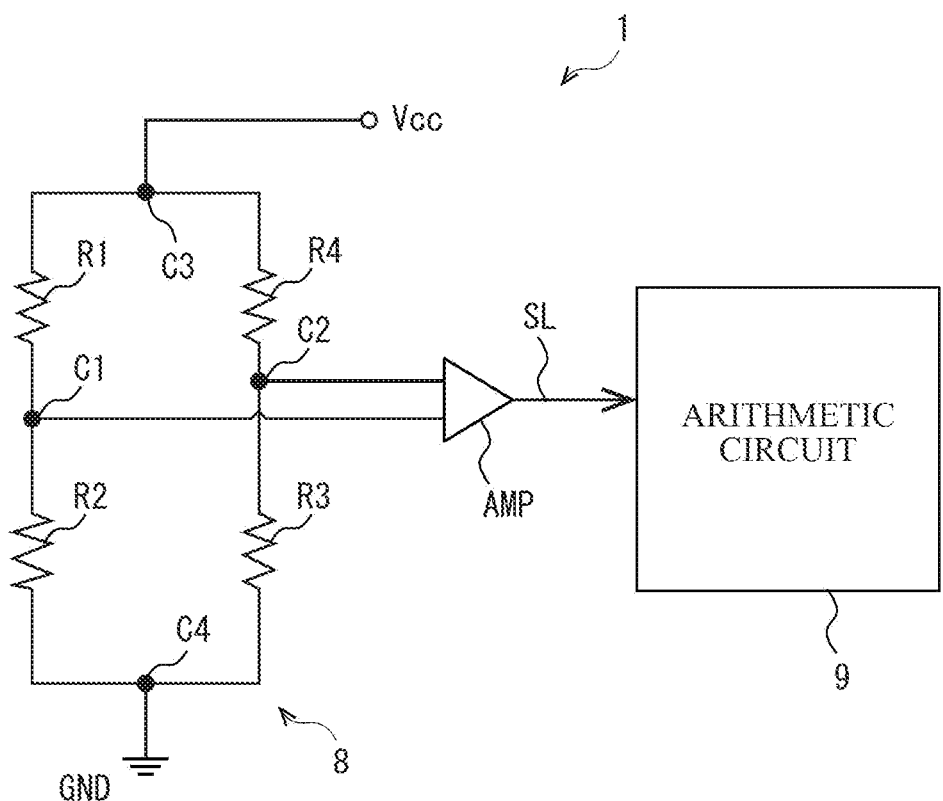
FIG. 4 is a circuit diagram of the angle sensor device illustrated in FIG. 1A.
Figure 4:
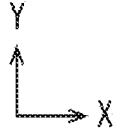

The sensor element circuitry 32 includes one or more magnetic sensor elements E. In some embodiments, the magnetic sensor elements E may include tunneling magnetoresistive effect (TMR) elements. The sensor element circuitry 32 may include sensor element groups. In the configuration example of FIG. 3B, the sensor element circuitry 32 may include four sensor element groups G1 to G4 arranged in a matrix. The sensor element groups G1 to G4 may each include four magnetic sensor elements E arranged in a matrix, for example. For convenience, the four magnetic sensor elements E are denoted as E1 to E4 in FIG. 3B. The magnetic sensor elements E1 to E4 may each include, for example, TMR films and wiring lines coupling the TMR films in series to each other. The magnetic sensor elements E1 to E4 may configure resistors R1 to R4 of a full-bridge circuit 8 illustrated in FIG. 4, for example. FIG. 4 is a circuit diagram illustrating a circuit configuration example of the angle sensor device 1. The angle sensor device 1 may include, for example, the full-bridge circuit 8, a difference detector AMP, and an arithmetic circuit 9. The angle sensor device 1 may be configured to detect a change in an external magnetic field applied to the sensor chip 3, based on a difference between a potential obtained at a node C1 and a potential obtained at a node C2 in the full-bridge circuit 8.

As illustrated in FIG. 3C, the sensor element circuitry 32 may include a sensor element layer 321 and a protective film 322 covering the sensor element layer 321. The sensor element layer 321 may include the one or more magnetic sensor elements E. The sensor element layer 321 may include the four sensor element groups G1 to G4, for example. The protective film 322 may include, for example, an insulating material such as silicon dioxide ($SiO_2$). In the example embodiment, the end face 32TS of the sensor element circuitry 32 may also serve as an end face of the protective film 322.

In the sensor chip 3, Expression (1) below may be satisfied:

$$0\% < |L1 - L2|/L1 \leq 1.56\% \tag{1}$$

where L1 represents a length of the sensor substrate 31 in any direction parallel to the front surface 31FS, and L2 represents a length of the sensor element circuitry 32 in the same direction.

For example, the following expression may be satisfied:

$$0\% < |L1X - L2X|/L1X \leq 1.56\%$$

where L1X represents the length of the sensor substrate 31 in the X-axis direction parallel to the front surface 31FS, and L2X represents the length of the sensor element circuitry 32 in the X-axis direction.

As another example, in the sensor chip 3, the following expression may be satisfied:

$$0\% < |L1Y - L2Y|/L1Y \leq 1.56\%$$

where L1Y represents the length of the sensor substrate 31 in the Y-axis direction parallel to the front surface 31FS, and L2Y represents the length of the sensor element circuitry 32 in the Y-axis direction.

In this way, in the sensor chip 3, Expression (1) above may be satisfied over an entire perimeter of the stacked structure including the sensor substrate 31 and the sensor element circuitry 32, as long as the relevant direction is parallel to the front surface 31FS, for example.

Further, a distance from the perimeter 31K of the sensor substrate 31 to the perimeter 32K of the sensor element circuitry 32 in a direction along the front surface 31FS may be, for example, greater than 0 μm and less than or equal to 5 μm over the entire perimeter of the stacked structure. For example, a distance DX (see FIGS. 3B and 3C) from the end face 31TS to the end face 32TS in the X-axis direction and a distance DY (see FIG. 3B) from the end face 31TS to the end face 32TS in the Y-axis direction may both be greater than 0 μm and less than or equal to 5 m. Note that the distance from the perimeter 31K to the perimeter 32K in the direction along the front surface 31FS may be constant or may vary. For example, the distance DX and the distance DY may be equal to or different from each other.

Moreover, Expression (2) below may be satisfied:

$$0.5 < (T2/T1) < 3 \tag{2}$$

where T1 represents the thickness of the sensor substrate 31 and T2 represents a thickness of the sensor element circuitry 32.

The full-bridge circuit 8 may include the four resistors R1 to R4. The resistor R1 may include the magnetic sensor element E1, the resistor R2 may include the magnetic sensor element E2, the resistor R3 may include the magnetic sensor element E3, and the resistor R4 may include the magnetic sensor element E4. The full-bridge circuit 8 may have a configuration in which the resistors R1 and R2 coupled in series and the resistors R3 and R4 coupled in series are coupled in parallel to each other. For example, in the full-bridge circuit 8, a first end of the resistor R1 and a first end of the resistor R2 may be coupled to each other at the node C1; a first end of the resistor R3 and a first end of the resistor R4 may be coupled to each other at the node C2; a second end of the resistor R1 and a second end of the resistor R4 may be coupled to each other at a node C3; and a second end of the resistor R2 and a second end of the resistor R3 may be coupled to each other at a node C4. The node C3 may be coupled to a power supply Vcc, and the node C4 may be coupled to a ground terminal GND. The node C1 and the node C2 may each be coupled to an input-side terminal of the difference detector AMP.

The resistors R1 to R4 may each be configured to detect a change in a signal magnetic field to be detected. For example, the resistors R1 and R3 may each decrease in resistance value in response to application of a signal magnetic field in a +Y direction, and may each increase in resistance value in response to application of a signal magnetic field in a −Y direction. The resistors R2 and R4 may each increase in resistance value in response to application of the signal magnetic field in the +Y direction, and may each decrease in resistance value in response to application of the signal magnetic field in the −Y direction. Accordingly, a signal to be outputted from each of the resistors R1 and R3 in response to a change in the signal magnetic field and a signal to be outputted from each of the resistors R2 and R4 in response to the change in the signal magnetic field may be different in phase by 180 degrees from each other, for example. The signals extracted from the resistors R1 to R4 of the full-bridge circuit 8 may flow into the difference detector AMP. The difference detector AMP may detect a potential difference between the nodes C1 and C2, that is, a difference between respective voltage drops occurring at the resistors R1 and R4, when a voltage is applied between the nodes C3 and C4, and may output the detected difference to the arithmetic circuit 9 as a difference signal SL.

[Wiring Layer 4]

As illustrated in FIG. 2, the wiring layer 4 may have a stacked structure including three resin layers 4A to 4C, for example. The resin layers 4A to 4C may each include, for example, polyimide, and may be provided to cover the sensor chip 3. Wiring line groups 7 may be embedded in the wiring layer 4. The wiring line groups 7 may each include a wiring line 71 and a wiring line 72, for example. The wiring line 71 may electrically couple the terminal part 21 of the support substrate 2 and corresponding one of the solder balls 5 to each other. The wiring line 72 may electrically couple the terminal part 22 of the support substrate 2 and the sensor chip 3 to each other.

[1.2. Method of Manufacturing Angle Sensor Device 1]

A description will now be given of a method of manufacturing the angle sensor device 1 according to an example embodiment of the disclosure with reference to FIGS. 5A to 5G, in addition to FIG. 2. FIGS. 5A to 5G schematically illustrate steps of an example method of manufacturing the angle sensor device 1.

Figure 5A:
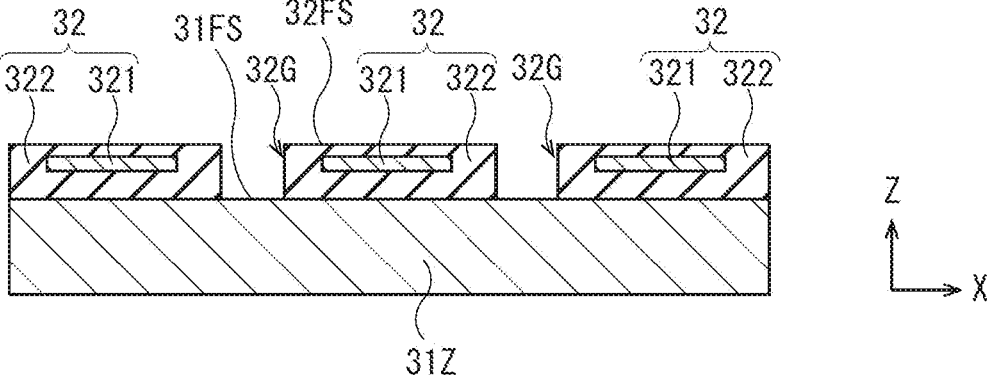
FIG. 5A is an explanatory diagram illustrating a step of an example method of manufacturing the angle sensor device illustrated in FIG. 1A.

First, as illustrated in FIG. 5A, one mother substrate 31Z including a silicon substrate, for example, may be prepared, following which a plurality of sensor element circuitries 32 may be formed on the front surface 31FS. The sensor element circuitries 32 may include the respective protective films 322 each having the sensor element layer 321 embedded therein. The sensor element circuitries 32 may be formed discretely to allow a spacing, that is, to have a gap 32G, between every adjacent ones of the protective films 322. The respective perimeters 32K of the sensor element circuitries 32 may each be provided with a substantially quadrangular plan shape, for example. Note that the mother substrate 31Z may be finally formed into a plurality of sensor substrates 31.

Figure 5B:
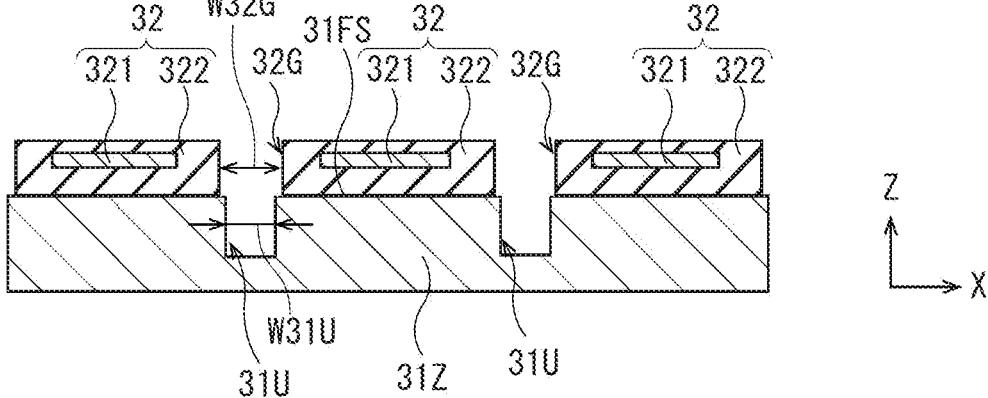
FIG. 5B is an explanatory diagram illustrating a step that follows the step of FIG. 5A.

Thereafter, as illustrated in FIG. 5B, trenches 31U may be formed by digging into regions of the front surface 31FS of the mother substrate 31Z exposed in the gaps 32G. For example, a method of forming the trenches 31U may be, and is not limited to, reactive ion etching (RIE). Other examples of the method may include machining with a dicing blade. The trenches 31U may be formed to cause an outline of an inner wall face of each of the trenches 31U formed in the mother substrate 31Z to have a substantially quadrangular plan shape that is substantially the same as a perimeter of the protective film 322. However, the trenches 31U may each be provided with a width W31U smaller than a width W32G of the gap 32G. For example, the trenches 31U may be formed to cause all of the perimeter 32K of each of the sensor element circuitries 32 to be recessed inward relative to a wall face of corresponding one of the trenches 31U as viewed in a plane parallel to the front surface 31FS.

Figure 5C:
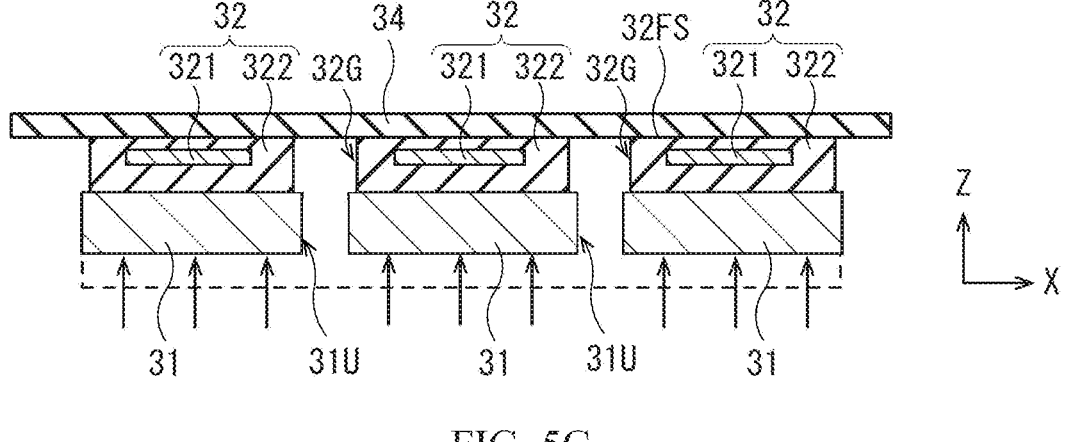
FIG. 5C is an explanatory diagram illustrating a step that follows the step of FIG. 5B.
Figure 5D:
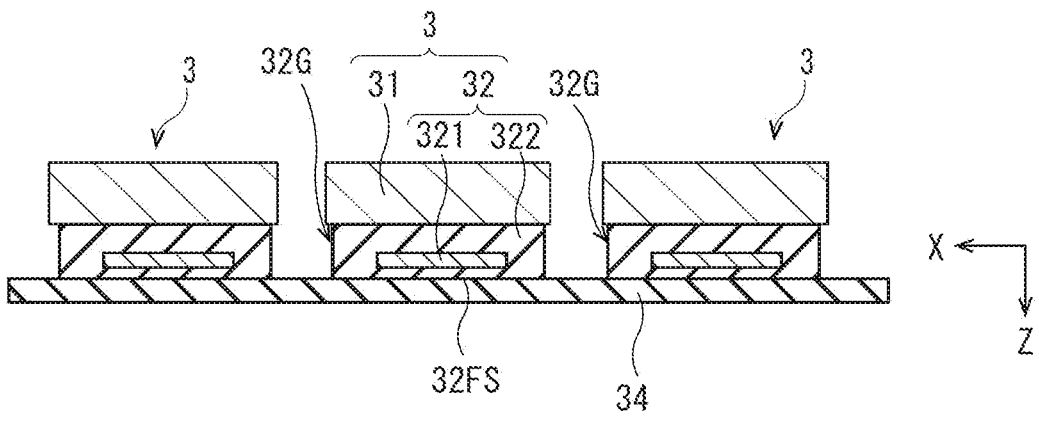
FIG. 5D is an explanatory diagram illustrating a step that follows the step of FIG. 5C.

Thereafter, as illustrated in FIG. 5C, a tape 34 may be attached to respective surfaces of the sensor element circuitries 32, following which a back surface of the mother substrate 31Z may be polished using, for example, a rotating grinding wheel, to thereby remove a portion in the thickness direction of the mother substrate 31Z over the entire back surface. The polishing may be performed to reach bottom surfaces of the trenches 31U. This may cause, as illustrated in FIG. 5D, the mother substrate 31Z to be divided into a plurality of sensor substrates 31 to form a plurality of singulated sensor chips 3. At this stage, the singulated sensor chips 3 may be in a state of adhering to the tape 34. Note that the orientation of the sensor chips 3 and the tape 34 in FIG. 5D is upside down from that in FIG. 5C.

Figure 5E:
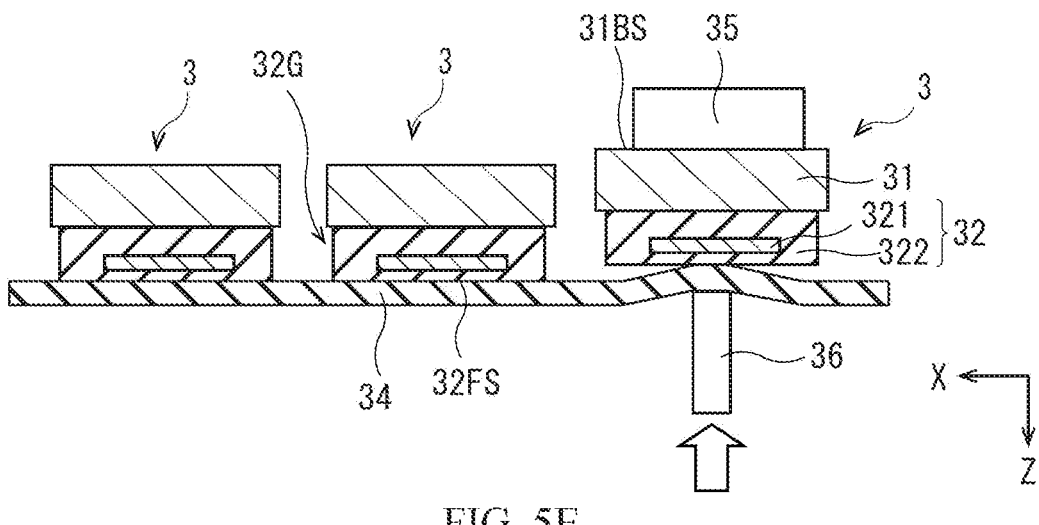
FIG. 5E is an explanatory diagram illustrating a step that follows the step of FIG. 5D.

Thereafter, as illustrated in FIG. 5E, with a pickup collet 35 caused to adhere to a back surface 31BS of the sensor substrate 31, a portion of the tape 34 may be pushed up with a pin 36 to thereby pick up a single sensor chip 3. The sensor chips 3 may be thereby picked up one by one.

Figure 5F:
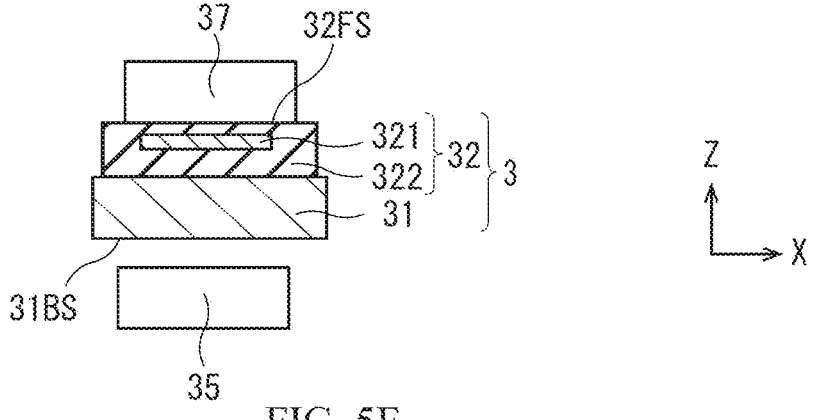
FIG. 5F is an explanatory diagram illustrating a step that follows the step of FIG. 5E.

Thereafter, as illustrated in FIG. 5F, a front surface 32FS of the sensor element circuitry 32 of the sensor chip 3 may be suctioned and held by a bonding collet 37, and the pickup collet 35 may be detached from the sensor substrate 31. Note that the orientation of the sensor chip 3 in FIG. 5F is upside down from that in FIG. 5E.

Figure 5G:
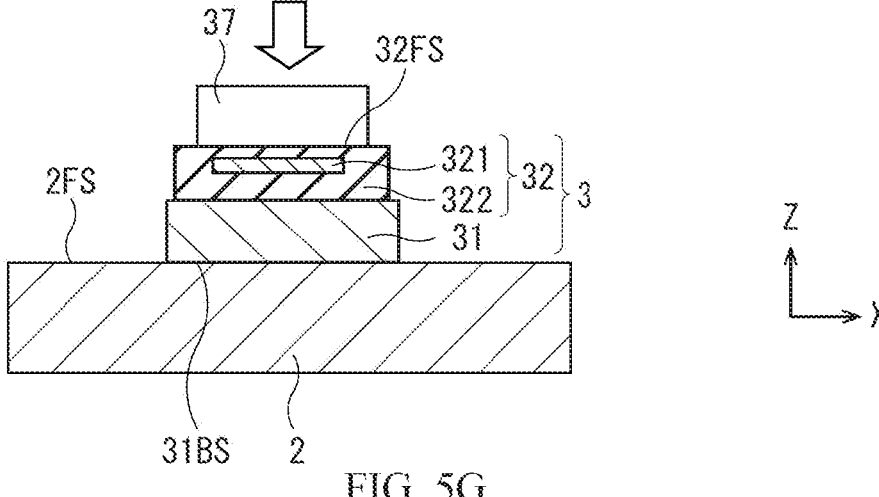
FIG. 5G is an explanatory diagram illustrating a step that follows the step of FIG. 5F.

Thereafter, as illustrated in FIG. 5G, the back surface 31BS of the sensor substrate 31 may be bonded to the front surface 2FS of the support substrate 2 prepared, with use of, for example, an adhesive. The sensor chip 3 may be thereby fixed onto the support substrate 2.

Thereafter, the wiring layer 4 may be formed to cover the sensor chip 3 provided on the support substrate 2. The wiring layer 4 may include a resin such as polyimide. Thereafter, portions of the wiring layer 4 may be selectively removed by, for example, photolithography, and the wiring lines 71 and 72 may be formed by, for example, plating. Lastly, the solder balls 5 may be formed. The protective film 6 may be formed on the back surface 2BS of the support substrate 2 on an as-needed basis.

The angle sensor device 1 according to the example embodiment may be completed in the above-described manner.

[1.3. Example Workings and Example Effects]

In the angle sensor device 1 according to the example embodiment, in a planar view, all of the perimeter 32K of the sensor element circuitry 32 is located at a position different from the position of the perimeter 31K of the sensor substrate 31. Accordingly, as compared with a case where the position of the perimeter 32K of the sensor element circuitry 32 is coincident with the position of the perimeter 31K of the sensor substrate 31 in a planar view, concentration of stress on a vicinity of the perimeter 32K of the sensor element circuitry 32 is mitigated when an external force is applied to the angle sensor device 1. The angle sensor device 1 according to the example embodiment thus reduces distortion of the sensor element circuitry 32, allowing for a reduced influence on measurement accuracy. Accordingly, the angle sensor device 1 helps to ensure high measurement accuracy even if the sensor substrate 31 is reduced in thickness.

Supposing, however, the position of the perimeter 32K of the sensor element circuitry 32 is coincident with the position of the perimeter 31K of the sensor substrate 31 in a planar view, stress would be concentrated on the vicinity of the perimeter 32K of the sensor element circuitry 32. In such a case, when the sensor chips 3 are singulated by polishing the mother substrate 31Z as illustrated in FIG. 5C in the manufacturing process, for example, end parts of the divided sensor substrates 31 can suffer cracking or chipping. In contrast, the example embodiment allows for avoidance of such damage to each sensor substrate 31 by locating the perimeter 32K of the sensor element circuitry 32 at a position different from the position of the perimeter 31K of the sensor substrate 31. For example, when Expression (2) described above is satisfied, that is, when the thickness of the sensor substrate 31 has a value equal to or close to that of the thickness of the sensor element circuitry 32, the sensor substrate 31 is highly susceptible to cracking or chipping if the position of the perimeter 32K and the position of the perimeter 31K are coincident with each other in a planar view. Thus, locating all of the perimeter 32K of the sensor element circuitry 32 at a position different from the position of the perimeter 31K of the sensor substrate 31, as in the angle sensor device 1 of the example embodiment, helps to effectively prevent the cracking and chipping of the sensor substrate 31.

2. EXAMPLES

Examples 1 to 8

The angle sensor device 1 of the above-described example embodiment illustrated in, for example, FIG. 1 was examined for performance. In more detail, a maximum angle error [deg.] was determined by simulation on the angle sensor device 1 including the sensor chip 3 illustrated in, for example, FIGS. 3A to 3C. With the lengths L1X and L1Y of the sensor substrate 31 both set to 640 m, the lengths L2X and L2Y of the sensor element circuitry 32 were selected to cause both the distances DX and DY to have predetermined values greater than or equal to 2 µm and less than or equal to 20 µm as illustrated in FIG. 3B. Further, the thickness T1 of the sensor substrate 31 and the thickness T2 of the sensor element circuitry 32 were both set to 15 m. The maximum angle error [deg.] was determined as follows. With an observation point set to a position shifted from a center position of the sensor substrate 31 by 300 µm in the X-axis direction and by 160 µm in the Y-axis direction, the maximum angle error [deg.] was calculated based on a compressive stress σx in the X-axis direction, a compressive stress σy in the Y-axis direction, and a shear stress τxy in an XY direction that were to be generated at the observation point upon a change in an ambient temperature Ta from 150° C. to −55° C. Note that a coefficient of linear expansion of each of the sensor substrate 31 and the sensor element circuitry 32 was set to 2.6 ppm/K. Further, a Young's modulus of each of the sensor substrate 31 and the sensor element circuitry 32 was set to 185 GPa.

Reference Example 1

An angle sensor device 1 including a sensor chip 3 of Reference Example 1 was subjected to determination of a maximum angle error [deg.] by simulation in a similar manner to that in Examples 1 to 8. Conditions of the sensor chip 3 of Reference Example 1 were similar to those of the sensor chips 3 of Examples 1 to 8 except that the distances DX and DY were both set to 0 µm to cause the end face 31TS of the sensor substrate 31 and the end face 32TS of the sensor element circuitry 32 to be coincident with each other in a planar view, that is, to cause the perimeter 31K of the sensor substrate 31 and the perimeter 32K of the sensor element circuitry 32 to be coincident with each other in a planar view.

Figure 6:
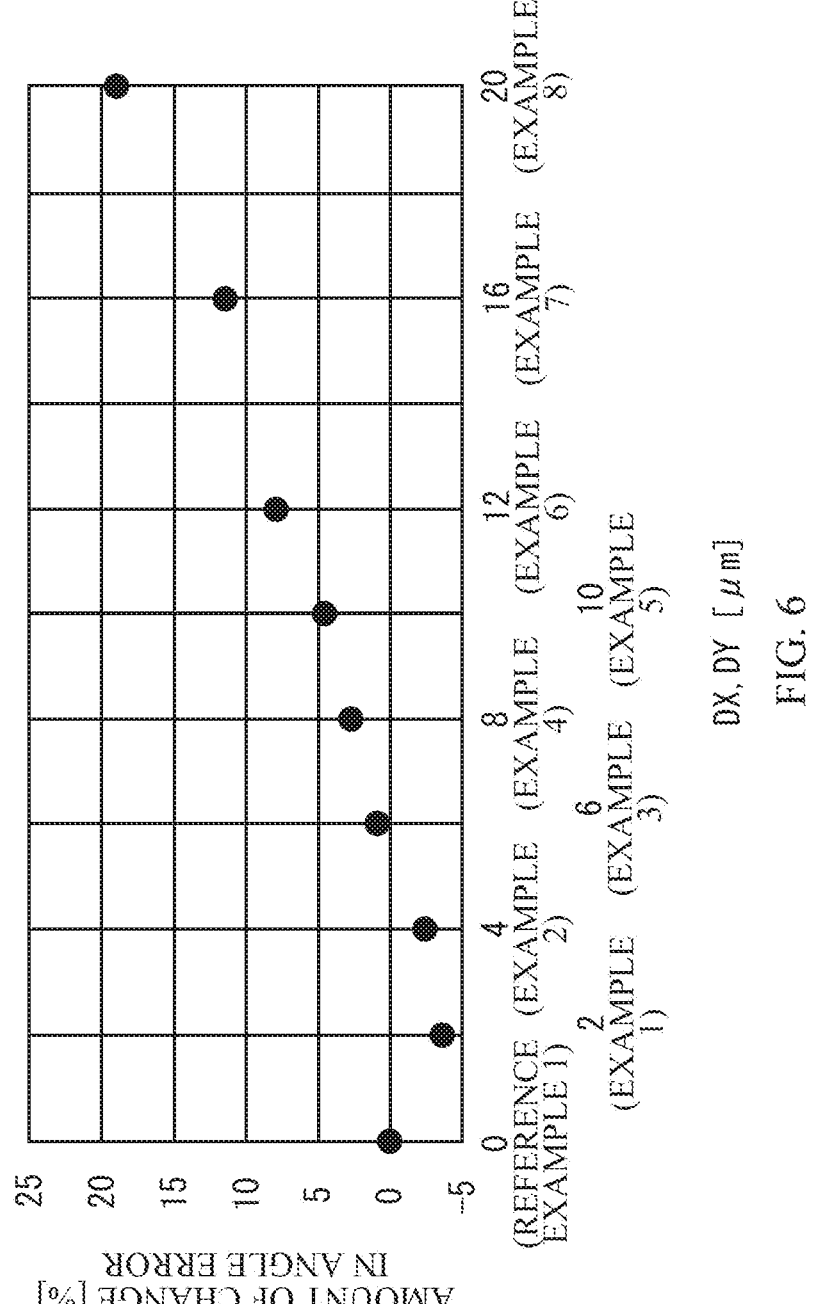
FIG. 6 is a characteristic diagram illustrating respective angle errors of angle sensor devices of Examples 1 to 8.

FIG. 6 illustrates a relation of the distances DX and DY versus an amount of change [%] in angle error determined by simulation for each of Examples 1 to 8 and Reference Example 1. The amount of change [%] in angle error refers to a value, expressed as a percentage, of an amount of deviation of the maximum angle error [deg.] from a reference value. Here, the maximum angle error [deg.] of Reference Example 1 was used as the reference value. The amount of change [%] in angle error of Reference Example 1 was thus 0%. A positive value of the amount of change [%] in angle error indicates that the maximum angle error [deg.] of relevant one of Examples 1 to 8 was greater than the maximum angle error [deg.] of Reference Example 1. A negative value of the amount of change [%] in angle error indicates that the maximum angle error [deg.] of relevant one of Examples 1 to 8 was smaller than the maximum angle error [deg.] of Reference Example 1.

The results illustrated in FIG. 6 indicate that it is possible to make the angle error smaller than that in Reference Example 1 if the distances DX and DY are both greater than 0 µm and less than or equal to 5 m, that is, if 0%<|L1X−L2X|/L1X≤1.56% and 0%<|L1Y−L2Y|/L1Y≤1.56%.

The example embodiment and Examples described above are to facilitate understanding of the disclosure, and are not intended to limit the disclosure. Each element disclosed in the foregoing example embodiment and Examples shall thus be construed to include all design modifications and equivalents that fall within the technical scope of the disclosure. In other words, the disclosure is not limited to the foregoing example embodiment and Examples, and may be modified in a variety of ways.

Figures 7A, 7B:
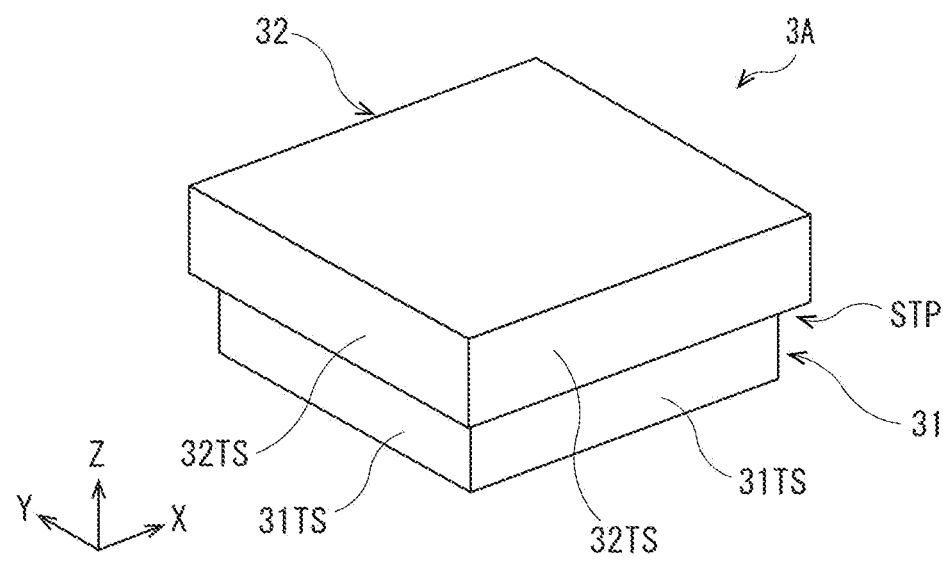
FIG. 7A is a perspective diagram illustrating an external appearance of a sensor chip according to a first modification example of one example embodiment of the disclosure.
FIG. 7B is a plan diagram illustrating a planar configuration example of the sensor chip illustrated in FIG. 7A.
Figure 7C:
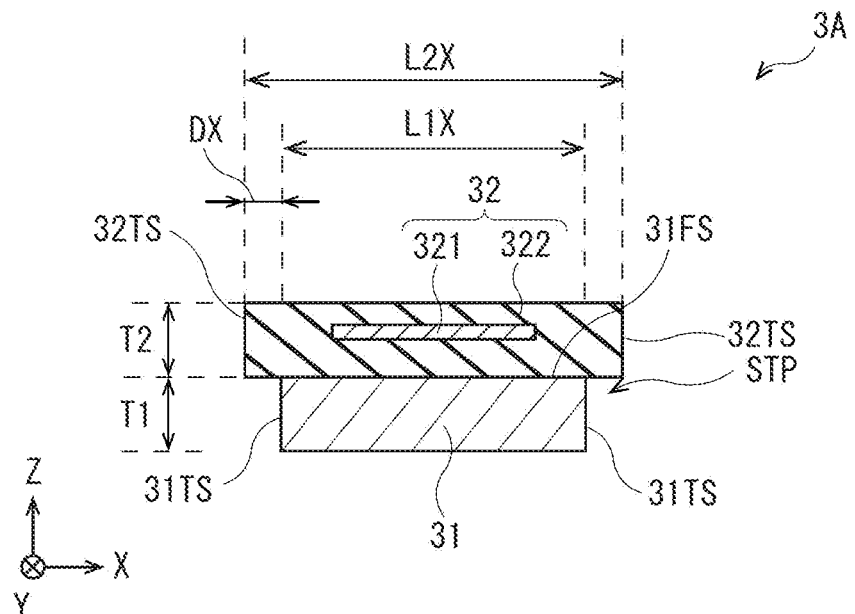
FIG. 7C is a cross-sectional diagram illustrating a cross-sectional configuration example of the sensor chip illustrated in FIG. 7A.

For example, in the sensor chip 3 of the angle sensor device 1 according to the foregoing example embodiment, all of the perimeter 32K of the sensor element circuitry 32 may be located on the inner side relative to the perimeter 31K of the sensor substrate 31 as viewed in a plane parallel to the front surface 31FS; however, embodiments of the disclosure are not limited thereto. For example, as in a sensor chip 3A according to a first modification example of an embodiment of the disclosure illustrated in FIGS. 7A to 7C, all of the perimeter 32K of the sensor element circuitry 32 may be located on an outer side relative to the perimeter 31K of the sensor substrate 31 as viewed in a plane parallel to the front surface 31FS. Moreover, in the sensor chip 3 of the angle sensor device 1 according to the foregoing example embodiment, all of the perimeter 32K of the sensor element circuitry 32 may be located at a position different from the position of the perimeter 31K of the sensor substrate 31 as viewed in a plane parallel to the front surface 31FS. However, in some embodiments, only a portion of the perimeter of the sensor element circuitry may be located at a position different from the position of the perimeter of the sensor substrate. Even in such a case, concentration of stress on the vicinity of the perimeter of the sensor element circuitry is mitigated as compared with a case where the position of all of the perimeter of the sensor element circuitry is coincident with the position of the perimeter of the sensor substrate.

It is possible to achieve at least the following configurations from the foregoing example embodiment and modification examples of the disclosure.

(1)

A magnetic sensor device including a stacked structure including a sensor substrate and a sensor element circuitry, the sensor substrate having a surface and a perimeter, the sensor element circuitry being provided on the surface of the sensor substrate, having a perimeter, and including one or more magnetic sensor elements, in which as viewed in a plane parallel to the surface, a portion or all of the perimeter of the sensor element circuitry is located at a position different from a position of the perimeter of the sensor substrate.

(2)

The magnetic sensor device according to (1), in which:

as viewed in a plane parallel to the surface, the portion or all of the perimeter of the sensor element circuitry is located on an outer side relative the perimeter of the sensor substrate; or as viewed in the plane parallel to the surface, the portion or all of the perimeter of the sensor element circuitry is located on an inner side relative the perimeter of the sensor substrate.

(3)

The magnetic sensor device according to (1) or (2), in which the stacked structure has a perimeter, and Expression (1) below is satisfied in a portion or all of the perimeter of the stacked structure:

$$0 \text{ percent} < |L1-L2|/L1 \leq 1.56 \text{ percent} \quad (1)$$

where L1 represents a length of the sensor substrate in a first direction along the surface, and L2 represents a length of the sensor element circuitry in the first direction.

(4)

The magnetic sensor device according to any one of (1) to (3), in which the stacked structure has a perimeter, and a distance from the perimeter of the sensor substrate to the perimeter of the sensor element circuitry in a first direction along the surface is greater than 0 micrometers and less than or equal to 5 micrometers in a portion or all of the perimeter of the stacked structure.

(5)

The magnetic sensor device according to any one of (1) to (4), in which Expression (2) below is satisfied:

$$0.5 < (T2/T1) < 3 \quad (2)$$

where T1 represents a thickness of the sensor substrate, and T2 represents a thickness of the sensor element circuitry.

(6)

The magnetic sensor device according to any one of (1) to (5), further including a support substrate supporting the sensor substrate.

(7)

The magnetic sensor device according to any one of (1) to (6), in which the sensor substrate has a thickness of 200 micrometers or less.

(8)

The magnetic sensor device according to any one of (1) to (7), in which the one or more magnetic sensor elements include one or more tunneling magnetoresistive effect elements.

(9)

A method of manufacturing a magnetic sensor device, the method including:

forming a plurality of sensor element circuitries discretely on a first surface of a mother substrate, the sensor element circuitries each including one or more magnetic sensor elements;

forming one or more trenches surrounding individual ones of the sensor element circuitries, by digging, from the first surface of the mother substrate, into one or more gap portions of the mother substrate that are each located in a gap region between adjacent ones of the sensor element circuitries; and separating the mother substrate into a plurality of sensor substrates by polishing the mother substrate from a second surface of the mother substrate to reach the one or more trenches, in which forming the one or more trenches includes causing a portion or all of a perimeter of each of the sensor element circuitries to protrude outward relative to a wall face of corresponding one of the one or more trenches as viewed in a plane parallel to the first surface, or causing a portion or all of the perimeter of each of the sensor element circuitries to be recessed inward relative to the wall face of corresponding one of the one or more trenches as viewed in the plane parallel to the first surface.

In a magnetic sensor device according to at least one embodiment of the disclosure, a portion or all of a perimeter of a sensor element circuitry is located at a position different from a position of a perimeter of a sensor substrate in a planar view. This mitigates concentration of stress on the vicinity of the perimeter of the sensor element circuitry when an external force is applied to the magnetic sensor device.

According to the magnetic sensor device of at least one embodiment of the disclosure, concentration of stress on the vicinity of the perimeter of the sensor element circuitry is mitigated when an external force is applied to the magnetic sensor device. Accordingly, distortion of the sensor element circuitry is reduced to allow for a reduced influence on measurement accuracy. The magnetic sensor device of at least one embodiment of the disclosure thus makes it possible to ensure high measurement accuracy even if the sensor substrate is reduced in thickness.

It is to be noted that the effects of the disclosure should not be limited thereto, and may be any of the effects described herein.

Although the disclosure has been described hereinabove in terms of the example embodiment and modification examples, the disclosure is not limited thereto. It should be appreciated that variations may be made in the described example embodiment and modification examples by those skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variants are defined as being largely but not necessarily wholly what is specified as understood by one of ordinary skill in the art. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A magnetic sensor device comprising
a stacked structure including a sensor substrate and a sensor element circuitry, the sensor substrate having a surface and a perimeter, the sensor element circuitry being provided on the surface of the sensor substrate, having a perimeter, and including one or more magnetic sensor elements,
wherein as viewed in a plane parallel to the surface, a portion or all of the perimeter of the sensor element circuitry is located at a position different from a position of the perimeter of the sensor substrate,
the stacked structure has a perimeter, and
Expression (1) below is satisfied in a portion or all of the perimeter of the stacked structure:

$$0 \text{ percent} < |L1 - L2|/L1 < 1.56 \text{ percent} \qquad (1)$$

where L1 represents a length of the sensor substrate in a first direction along the surface, and L2 represents a length of the sensor element circuitry in the first direction.

2. The magnetic sensor device according to claim 1, wherein:
as viewed in a plane parallel to the surface, the portion or all of the perimeter of the sensor element circuitry is located on an outer side relative the perimeter of the sensor substrate; or
as viewed in the plane parallel to the surface, the portion or all of the perimeter of the sensor element circuitry is located on an inner side relative the perimeter of the sensor substrate.

3. The magnetic sensor device according to claim 1, wherein
the stacked structure has a perimeter, and
a distance from the perimeter of the sensor substrate to the perimeter of the sensor element circuitry in a first direction along the surface is greater than 0 micrometers and less than or equal to 5 micrometers in a portion or all of the perimeter of the stacked structure.

4. The magnetic sensor device according to claim 1, wherein Expression (2) below is satisfied:

$$0.5 < (T2/T1) < 3 \qquad (2)$$

where T1 represents a thickness of the sensor substrate, and T2 represents a thickness of the sensor element circuitry.

5. The magnetic sensor device according to claim 1, further comprising a support substrate supporting the sensor substrate.

6. The magnetic sensor device according to claim 1, wherein the sensor substrate has a thickness of 200 micrometers or less.

7. The magnetic sensor device according to claim 1, wherein the one or more magnetic sensor elements comprise one or more tunneling magnetoresistive effect elements.

8. A magnetic sensor device comprising
a stacked structure including a sensor substrate and a sensor element circuitry, the sensor substrate having a surface and a perimeter, the sensor element circuitry being provided on the surface of the sensor substrate, having a perimeter, and including one or more magnetic sensor elements,
wherein as viewed in a plane parallel to the surface, a portion or all of the perimeter of the sensor element circuitry is located at a position different from a position of the perimeter of the sensor substrate,
the stacked structure has a perimeter, and
a distance from the perimeter of the sensor substrate to the perimeter of the sensor element circuitry in a first direction along the surface is greater than 0 micrometers and less than or equal to 5 micrometers in a portion or all of the perimeter of the stacked structure.

9. The magnetic sensor device according to claim 8, wherein:
as viewed in a plane parallel to the surface, the portion or all of the perimeter of the sensor element circuitry is located on an outer side relative the perimeter of the sensor substrate; or
as viewed in the plane parallel to the surface, the portion or all of the perimeter of the sensor element circuitry is located on an inner side relative the perimeter of the sensor substrate.

10. The magnetic sensor device according to claim 8, further comprising a support substrate supporting the sensor substrate.

11. The magnetic sensor device according to claim 8, wherein the sensor substrate has a thickness of 200 micrometers or less.

12. The magnetic sensor device according to claim 8, wherein the one or more magnetic sensor elements comprise one or more tunneling magnetoresistive effect elements.

13. A magnetic sensor device comprising
a stacked structure including a sensor substrate and a sensor element circuitry, the sensor substrate having a surface and a perimeter, the sensor element circuitry being provided on the surface of the sensor substrate, having a perimeter, and including one or more magnetic sensor elements,
wherein as viewed in a plane parallel to the surface, a portion or all of the perimeter of the sensor element circuitry is located at a position different from a position of the perimeter of the sensor substrate,
wherein Expression (2) below is satisfied:

$$0.5 < (T2/T1) < 3 \qquad (2)$$

where T1 represents a thickness of the sensor substrate, and T2 represents a thickness of the sensor element circuitry.

14. The magnetic sensor device according to claim 13, wherein:
as viewed in a plane parallel to the surface, the portion or all of the perimeter of the sensor element circuitry is located on an outer side relative the perimeter of the sensor substrate; or
as viewed in the plane parallel to the surface, the portion or all of the perimeter of the sensor element circuitry is located on an inner side relative the perimeter of the sensor substrate.

15. The magnetic sensor device according to claim 13, further comprising a support substrate supporting the sensor substrate.

16. The magnetic sensor device according to claim 13, wherein the sensor substrate has a thickness of 200 micrometers or less.

17. The magnetic sensor device according to claim 13, wherein the one or more magnetic sensor elements comprise one or more tunneling magnetoresistive effect elements.

5

* * * * *